United States Patent
Merrett et al.

(10) Patent No.: US 7,214,627 B2
(45) Date of Patent: *May 8, 2007

(54) GRADED JUNCTION TERMINATION EXTENSIONS FOR ELECTRONIC DEVICES

(75) Inventors: J. Neil Merrett, Starkville, MS (US); Tamara Isaacs-Smith, Auburn, AL (US); David C. Sheridan, South Burlington, VT (US); John R. Williams, Opelika, AL (US)

(73) Assignee: Auburn University, Auburn, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/201,066

(22) Filed: Aug. 9, 2005

(65) Prior Publication Data

US 2006/0172543 A1    Aug. 3, 2006

Related U.S. Application Data

(63) Continuation of application No. 10/324,564, filed on Dec. 19, 2002, now Pat. No. 7,033,950.

(60) Provisional application No. 60/342,198, filed on Dec. 19, 2001.

(51) Int. Cl.
   *H01L 21/302* (2006.01)

(52) U.S. Cl. .................... 438/745; 438/708

(58) Field of Classification Search .............. 438/694, 438/706, 608, 713, 717, 745, 133, 931
See application file for complete search history.

(56) References Cited

U.S. PATENT DOCUMENTS

| | | | |
|---|---|---|---|
| 4,648,174 A | 3/1987 | Temple et al. ................. 29/578 |
| 4,667,393 A | 5/1987 | Ferla et al. | |
| 4,927,772 A | 5/1990 | Arthur et al. ................... 437/6 |
| 5,192,699 A * | 3/1993 | Bulat et al. .................. 438/192 |
| 5,362,658 A * | 11/1994 | Kuragaki ..................... 438/320 |
| 5,654,208 A | 8/1997 | Harris et al. ................. 438/522 |
| 5,998,288 A * | 12/1999 | Gardner et al. ............. 438/589 |
| 6,005,261 A | 12/1999 | Konstantinov ................ 257/77 |
| 6,083,814 A | 7/2000 | Nilsson ........................ 438/519 |
| 6,215,168 B1 | 4/2001 | Brush et al. ................. 257/494 |
| 6,348,367 B1* | 2/2002 | Ohtani et al. ............... 438/151 |
| 6,455,911 B1 | 9/2002 | Stephani et al. ............. 257/493 |
| 6,693,011 B2 | 2/2004 | Wahl et al. .................. 438/270 |
| 6,734,462 B1 | 5/2004 | Shah ............................ 257/77 |
| 7,033,950 B2* | 4/2006 | Merrett et al. .............. 438/708 |
| 2001/0009788 A1 | 7/2001 | Lipkin et al. ................ 438/285 |

OTHER PUBLICATIONS

Wolf "Silicon Processing for the VLSI Era", vol. 1, Lattice Press, pp. 408, 414, no date.*

* cited by examiner

*Primary Examiner*—Kin-Chan Chen
(74) *Attorney, Agent, or Firm*—Haverstock & Owens LLP

(57) ABSTRACT

A graded junction termination extension in a silicon carbide (SiC) semiconductor device and method of its fabrication using ion implementation techniques is provided for high power devices. The properties of silicon carbide (SiC) make this wide band gap semiconductor a promising material for high power devices. This potential is demonstrated in various devices such as p-n diodes, Schottky diodes, bipolar junction transistors, thyristors, etc. These devices require adequate and affordable termination techniques to reduce leakage current and increase breakdown voltage in order to maximize power handling capabilities. The graded junction termination extension disclosed is effective, self-aligned, and simplifies the implementation process.

32 Claims, 4 Drawing Sheets

DISTANCE FROM EDGE OF ACTIVE AREA

DISTANCE FROM EDGE OF ACTIVE AREA

GRADED JUNCTION TERMINATION EXTENSIONS FOR ELECTRONIC DEVICES

CROSS-REFERENCE TO RELATED APPLICATION

This Patent Application is a continuation of co-pending U.S. patent application Ser. No. 10/324,564, filed on Dec. 19, 2002, and entitled "GRADED JUNCTION TERMINATION EXTENSIONS FOR ELECTRONIC DEVICES", now U.S. Pat. No. 7,033,950 which claims priority under 35 U.S.C. 119(e) of the co-pending U.S. Provisional Patent Application, Ser. No. 60/342,198, filed Dec. 19, 2001, and entitled "GRADED JUNCTION TERMINATION EXTENSIONS FOR ELECTRONIC DEVICES". The U.S. patent application Ser. No. 10/324,564, filed on Dec. 19, 2002 and entitled "GRADED JUNCTION TERMINATION EXTENSIONS FOR ELECTRONIC DEVICES", now U.S. Pat. No. 7,033,950 and the Provisional Patent Application, Ser. No. 60/342,198 filed Dec. 19, 2001, and entitled "GRADED JUNCTION TERMINATION EXTENSIONS FOR ELECTRONIC DEVICES" are both also hereby incorporated by reference.

STATEMENT REGARDING FEDERALLY SPONSORED RESEARCH

The invention disclosed herein was supported by NASA Grant No. NAGV-1192 through the Center for Space Power and Advanced Electronics of the Auburn University Space Power Institute. The U.S. Government has certain rights in the invention.

TECHNICAL FIELD

This invention relates generally to power semiconductor devices and more specifically to power semiconductor devices in which graded junction termination extensions (GJT) are formed to increase the breakdown voltage of the device, and to processes for fabricating same.

BACKGROUND OF THE INVENTION

Junction termination extensions (JTEs) and graded junction termination extensions (GJTEs) have been utilized as a device edge passivation technique in high voltage semiconductor devices such as MOSFETs, IGBTs, MCTs, bipolar transistors, thyristors, and diodes. In such devices, the maximum reverse voltage that the device can withstand is limited by the breakdown voltage of the reverse-blocking junction. However, the actual breakdown voltage of the junction normally falls short of the breakdown voltage that might ideally be achieved because of the development of excessively high field strengths at the termination of the junction between the P region and the N region, usually at a location slightly above the metallurgical junction along a region of curvature at the junction termination. The formation of JTEs that overlap and extend laterally from such junctions act to spread the high field strengths over wider areas and thereby increase the voltage at which avalanche breakdown occurs.

Various techniques, generally employing well known masking, doping, and diffusion processes, have been developed for forming JTEs and GJTEs in semiconductor devices, such as diodes, that are formed on silicon substrates. U.S. Pat. No. 4,927,772 of Arthur et al., U.S. Pat. No. 4,648,174 of Temple et al., and U.S. Pat. No. 6,215,168 of Brush et al. all disclose and discuss examples of such techniques and the disclosures of these patents are hereby incorporated by reference. Traditional masking, doping and diffusion techniques work well with semiconductor devices fabricated on silicon because dopants applied to the silicon diffuse into the silicon with relative ease at reasonable temperatures. As a result, the formation of JTEs and GJTEs in silicon-based semiconductor devices has become standard practice, particularly in higher voltage devices.

Materials other than silicon have been demonstrated to exhibit characteristics superior to silicon as a substrate in high power semiconductor devices. One such material is silicon carbide (SiC). An attractive property of SiC is that its critical field strength is over ten times that of silicon. For a given voltage rating, this high field strength translates to a two to three order of magnitude reduction in the specific on-resistance of the drill region of an SiC power device. Unfortunately, just as in silicon devices, ideal blocking voltage is difficult to achieve due to effects at the device edge. For planar devices, field line crowding causes the electric field to be higher at the perimeter than in the bulk of the device. This field crowding can cause increased leakage current and ultimately premature breakdown of the device. Field line crowding can be reduced with etched mesa isolation; however, damage from etching can also cause leakage and premature breakdown at the device edges.

Many techniques have been employed to remedy this periphery problem. Guard rings, field plates, argon implantation, and junction termination extensions (JTEs) have been used for planar SiC devices. Beveled sidewalls and multiple step etching, as well as JTEs, have been used for mesa-isolated devices. These methods have been successful for the most part, but each method has its particular drawbacks. Guard rings are often difficult to fabricate; field plates are limited by the strength of the dielectric used; argon implantation can increase reverse leakage current; beveled etching is less effective with abrupt, one-sided negative junctions, and multiple step etching complicates the beveling process with additional fabrication steps. Junction termination extensions have been widely used, but JTEs are difficult to optimize and implement with a SiC substrate and GJTEs, which require multiple zones of decreasing implant dose in order to achieve ideal breakdown for a junction, are even more difficult to implement. These difficulties are due in large measure to the fact dopants do not diffuse into the SiC substrate material as they do into silicon, except at extremely high temperatures that tend to destroy the SiC material itself. More specifically, the combination of implantation/diffusion is not feasible for SiC because almost all atoms have extremely low diffusion coefficients in SiC at temperatures below 2,000° C., which is very nearly the bulk growth temperature of SiC itself. Thus, traditional masking, implantation, and diffusion techniques typically used to create JTEs and GJTEs in silicon-based semiconductor devices simply are not available for use in SiC-based semiconductor devices.

Accordingly, a need exists for reliable techniques and methodologies for forming JTEs and GJTEs in semiconductor devices utilizing materials other than silicon, such as SiC, in order to take full advantage of the superior performance of such materials in high voltage semiconductor devices. It is to the provision of such techniques that the present invention is primarily directed.

SUMMARY OF THE INVENTION

The properties of silicon carbide as compared to silicon makes silicon carbide an ideal semiconductor material for high power devices. In comparing the suitability of a silicon or a silicon carbide device having the same geometries and size, the silicon carbide device should be able to handle much higher power levels. The power level is basically the product of the voltage that the device experiences and the current that the device carries. Thus, for example, a single SiC transistor may handle the same current at a particular voltage as four or five large silicon transistors. Basic properties of SiC materials, such as band gap, thermal conductivity, saturated electronic drift velocity, and critical breakdown field, also favor silicon carbide over silicon. Silicon carbide also is a much more robust material when dealing with high voltages and high currents that produces substantial heat in a device that must be dissipated. The heat can be dissipated away from the silicon carbide device much quicker than a silicon device because of the silicon carbide device's thermal conductivity. Furthermore, the band gap in silicon carbide is approximately three times that of the band gap in silicon. Thus, the silicon carbide device will maintain its semiconductor characteristics up to much higher temperatures. Junction breakdown voltage decreases as doping level increases. Breakdown voltage is also a function of the radius of curvature of the junction space-charge region. For high power devices, whether made of silicon or silicon carbide, a junction termination extension is needed to prevent breakdown due to field line crowding at the periphery of the active area of the device.

The present invention provides a graded junction termination extension (GJTE) that is self-aligning to simplify the ion implementation process during fabrication, thereby reducing production costs for electronic devices such as power semiconductor devices. The novel graded junction termination extension and method of fabrication produces an implanted dopant distribution that varies in concentration moving away from the edge of the active area of a device.

Briefly described, the present invention, in a preferred embodiment thereof, is directed to graded junction termination extensions that are very effective in increasing the breakdown voltage of implanted silicon carbide (SiC) junction diodes. This technique can easily be used to terminate other devices such as Schottky diodes, bipolar junction transistors, or thyristors. The key to making a GJTE is the fabrication of a graded photoresist mask that is used to create a carbon implant mask, or as an etch mask for making an oxide implant mask. Of the methods described here, the defocused lithography pattern is the preferred method for grading photoresist masks. Exposing the photoresist with a sufficient gap between the lithography mask and the photoresist is only one way to blur the pattern. If a wafer stepper is available for patterning, the pattern can simply be defocused before exposing the photoresist in order to create the same edge blurring effect. In addition, a gray-scale lithography mask can be used to bevel the edge of the photoresist. With this mask, a light intensity gradient is designed into the mask itself. Once the process is established for a given application and fabrication process, the GJTE is a very effective, cost-efficient method for power device termination.

BRIEF DESCRIPTION OF THE DRAWINGS

The invention is better understood by reading the following detailed description of an exemplary embodiment in conjunction with the accompanying drawings.

DETAILED DESCRIPTION OF THE INVENTION

Figure 1:
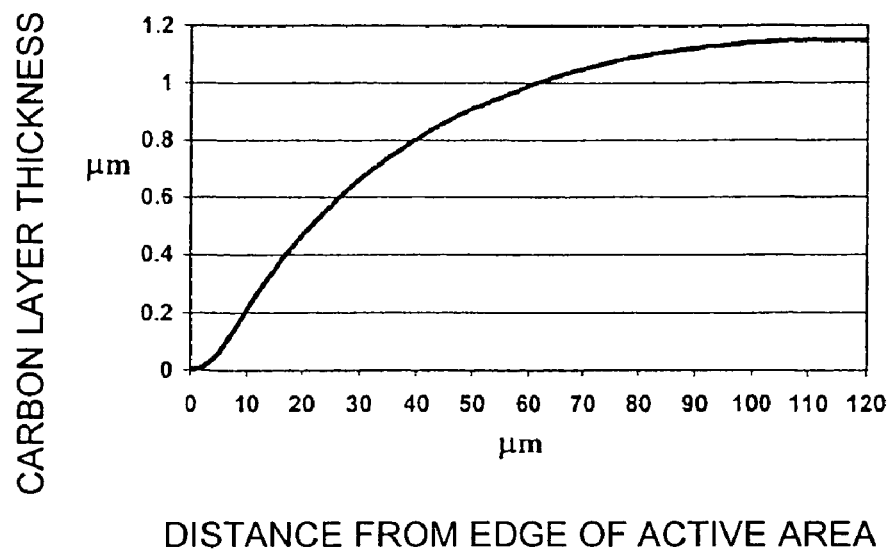
FIG. 1 illustrates a thickness profile for a graded carbon implant mask measured with a stylus profilometer.

The following description of the invention is provided as an enabling teaching of the invention in its best, currently known embodiment. Those skilled in the relevant art will recognize that many changes can be made to the embodiment described, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and may even be desirable in certain circumstances, and are a part of the present invention. Thus, the following description is provided as illustrative of the principles of the present invention and not in limitation thereof, since the scope of the present invention is defined by the claims.

Junction termination extension (JTE) is one of several passivation techniques used with power semiconductor devices to prevent breakdown due to field line crowding at the periphery of the active area of the device. All semiconductor power devices have passivation of some kind. Device performance (e.g., higher breakdown voltage) can be significantly improved using proper JTE procedures, and the fabrication of junction termination extensions that have graded implant concentrations as one moves away from the active region of a semiconductor device. By graded, it is meant that the concentration of implanted dopant atoms (i.e., the number of atoms/$cm^3$) decreases with distance from the periphery of the active region. This grading is produced by using a mask set for implantation that has patterns of different shape and size according to the distance from the edge of the device active area. All of the remaining device area adjacent to the active area is not implanted, rather only selected portions of the remaining area that are exposed by the openings in the mask set. Implantation is carried out at several different energies with one or more doses at each energy; however, all of the open patterns in the mask set are implanted identically. A graded concentration is then achieved by heating the sample, usually silicon, to diffuse the implanted species. The combination of diffusion and the pattern of the open areas in the mask set determines the spatial variation of the implanted dopants as one moves away from the edge of the active area of the device.

The present invention describes a graded junction termination extension (GJTE) process usable with SiC semiconductor devices that is effective and self-aligned to simplify the ion implantation process during fabrication so as to potentially reduce production costs for electronic devices such as power semiconductor devices. The new type graded junction termination extension and method of fabrication disclosed herein produces implanted dopant distributions that vary in concentration and depth as one moves away from the edge of the active area of the device. The effectiveness of this new graded junction termination extension has been demonstrated in the fabrication of implanted p-n junction diodes where the application of the GJTE improves breakdown voltage by more than a factor of two compared to diodes that were not terminated. Details of the GJTE fabrication process and the preliminary results achieved are described in more detail below.

The material used in GJTE experiments is available from Cree, Inc., and includes an $n^+$ 4H-SiC substrate with a 10 µm $n^-$ epitaxial layer doped at $4.6 \times 10^{15}$ cm$^{-3}$. A carbon mask for implanting the anodes and the diodes was fabricated as follows. An AZ® 5214-E positive photoresist manufactured by Clariant was spun onto a 5 mm by 5 mm square piece of material at 400 rpm for 30 sec. The sample was then baked in an oven at 90° C. for 90 min. The photoresist was exposed through a dark field mask having a window diameter of 312 µm for 45 sec to ultraviolet (UV) light from a 160 W mercury (Hg) lamp. Exposure was performed with the photoresist surface separated from the mask by a few millimeters. This was accomplished by setting the stage on a Karl Suss MJB3 photo mask aligner to its lowest position before exposure. The sample was then developed for 2 min. in Microposit H$_2$O:351 (3:1) developer available from Shipley Company, Inc. Exposing the sample with the mask away from the surface of the photoresist causes the light at the perimeter of each circular window to be out of focus. For a positive photoresist, the rate at which the photoresist is dissolved in the developing solution is proportional to the amount of light absorbed during exposure. Therefore, instead of the usual well-defined vertical step, the edges of the photoresist are gently sloped.

After another bake in the 90° C. oven for about an hour, the photoresist pattern had a thickness of about 6.9 µm away from the sloped edges. The spin speed and baking procedures provided herein are far different from those recommended by the manufacturer since the photoresist used in this experiment is designed for much thinner applications and was used simply because of availability. Other, thicker photoresists can be used to produce a similar mask pattern with much less difficulty. A carbon strip furnace was then used to anneal the sample in flowing argon (Ar). During the anneal, the temperature was increased at an average rate of about 60° C./mm to 1000° C. where it was then held for 10 min. This anneal converted the photoresist into a carbon film with a thickness averaging about 1.2 µm. Annealing vacuum instead of argon was found to produce similar, but slightly thinner carbon films. A profile of the carbon film taken at the edge of a circular window is shown in FIG. 1. The ordinate (y-axis) is carbon layer thickness. The abscissa (x-axis) is distance from the edge of the circular window that defines the active area of the device.

In order to simulate implant profiles using the software package TRIM, the density of the carbon film had to be determined. This was accomplished using Rutherford Backscattering Spectrometry (RBS) techniques. A density of 1.475 gm/cm$^3$ was determined by adjusting the density used in the simulation until the carbon thickness derived from the RBS data matched the thickness obtained using a stylus profilometer. Once the density has been determined for a particular carbon film fabrication process, the RBS analysis need not be repeated.

Figure 2:
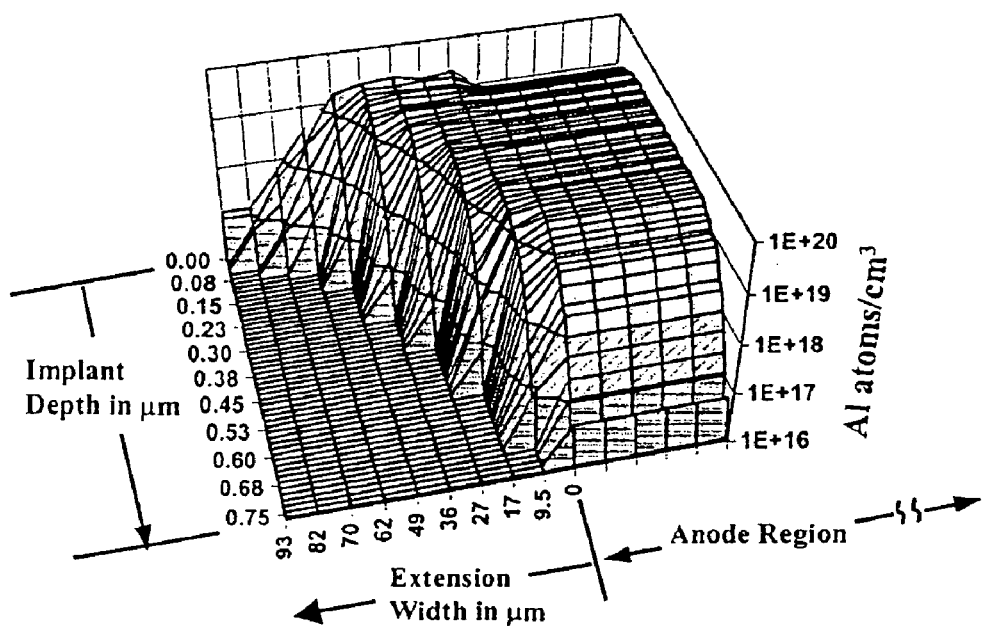
FIG. 2 illustrates a TRIM implant profile simulation showing dopant concentrations of the anode region and the GJTE region at the perimeter of the anode.

Because of difficulty producing low energy ions with the accelerator used for implantation, a 90 nm molybdenum (Mo) layer was sputtered over the entire sample to bring the minimum energy ions to the surface of the SiC. Aluminum (Al) ions were implanted at 700° C. with multiple energies ranging from 170 to 525 keV to produce a box profile anode region with a maximum concentration of $2 \times 10^{19}$ cm$^3$. Along the perimeter of the anodes, however, the implant took on a profile similar to that of the carbon implant mask. FIG. 2 depicts a TRIM implant profile simulation showing dopant concentrations of the anode region and the GJTE region at the perimeter of the anode. Spatially, the depth of the implanted region tapered off to zero around 100 µm from the edge of the anode region. Also, note in FIG. 2 that the concentration in the extension region also decreases gradually as the extension extends laterally from the edge of the anode region.

After ion implantation, the Al ions were activated by annealing at 1700° C. for 30 min. in flowing argon at slightly above atmospheric pressure. The sample was annealed in a SiC box that contained a small amount of Si to prevent preferential sublimation of Si from the SiC surface. Before annealing, the Mo implant mask layer was chemically etched away. The carbon mask layer was removed using an oxygen plasma. For samples annealed with the carbon mask layer in place, it was discovered that high temperature annealing in the presence of silicon grows SiC on the surface of the carbon film, making removal very difficult. Following activation, anode and cathode contacts were fabricated from Al$_{90}$Ti$_{10}$ and Ni$_{93}$V$_7$ alloys, respectively. Both contacts were annealed with one three minute, 1000° C. anneal in a vacuum. The anode contact area was $7.26 \times 10^{-4}$ cm$^2$. Another sample with a vertical wall Mo implant mask was processed with the GJTE sample as a control reference. Neither sample had a thermal or deposited oxide for passivation.

Figure 3:
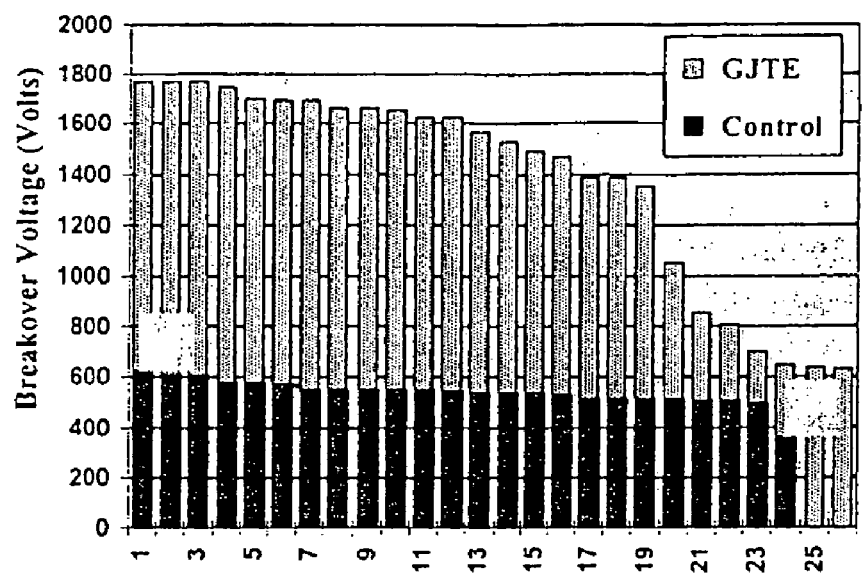
FIG. 3 illustrates a breakdown voltages for p-n diodes as measured in Florinert.

Reverse breakdown measurements were first taken at room temperature in Florinert, an inert organic liquid, using a Tektronix 371A curve tracer. Out of the thirty-five devices fabricated on each 5 mm×5 mm sample, the GJTE and the control samples yielded twenty-six and twenty-four working devices, respectively. For the GJTE sample, breakdown voltages ranged from 630 V to 1770 V and averaged 1380 V. Breakdown voltages for the control samples ranged from 360 V to 624 V and averaged 537 V. FIG. 3 shows the distribution of breakdown voltages for p-n diodes as measured in Florinert for both samples. Each column represents the breakdown voltage of one diode. After testing the devices on the curve tracer, one of the best devices from each of the two die was then tested with a system that stepped the reverse voltage in ten-volt increments until breakdown was observed. Testing in this manner produced somewhat higher breakdown voltages than were obtained with the curve-tracer, where the voltage was swept continuously. The maximum breakdown voltage increased from 1770 V to 1830 V for the GJTE device and from 624 V to 939 V for the control device. Numerical simulations made with MEDICI device simulator software from Avanti predicted a breakdown voltage of 1900 V for an ideal planar device with a 9 µm drift layer of the same concentration.

Figure 4:
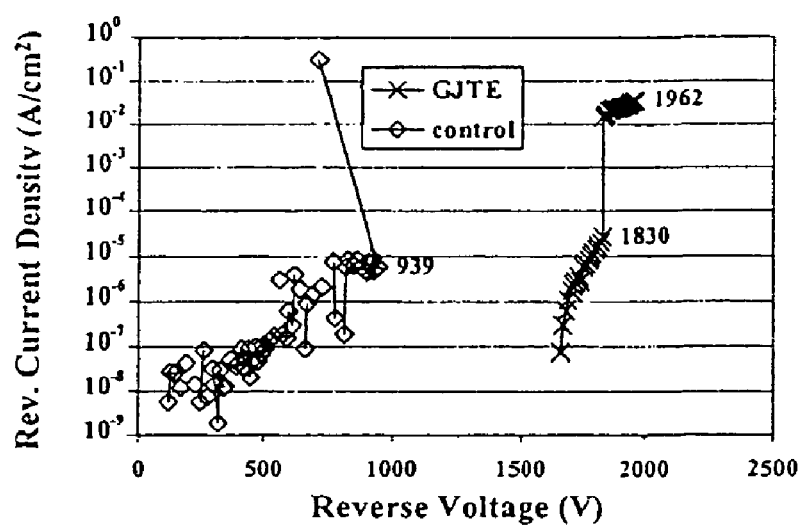
FIG. 4 illustrates a reverse current density versus applied voltage for implanted SiC p-n diodes with and without GJTE termination.
Figure 5:
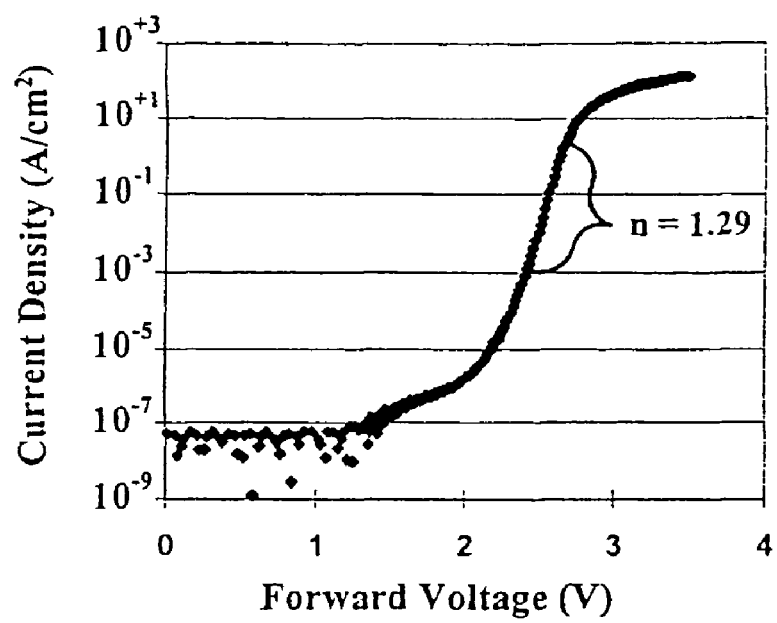
FIG. 5 illustrates forward current-voltage characteristics of an 1800 V SiC p-n diode fabricated with a graded junction termination extension.

Reverse current-voltage measurements for the two devices are shown in FIG. 4. The lack of data points at lower voltages for the GJTE device indicates that currents at these voltages were below the measurement threshold of the system. Forward current-voltage characteristics revealed no distinct differences between the GJTE sample and the control sample. As illustrated in FIG. 5, forward current-voltage (I-V) measurements for a typical GJTE device showed a turn-on voltage of approximately 2.8 V and an ideality factor of 1.3 in the range from about $1 \times 10^{-3}$ to 2 A/cm$^2$.

Breakdown voltages for the GJTE devices approach ideal (as determined by numerical simulation) with an average breakdown voltage over 2.5 times the average of the control devices. Thus, it appears that the graded junction termination extensions are very effective in preventing premature edge breakdown. With conventional JTEs, detailed calculations based on an accurate knowledge of the activated dopant concentration are normally required. No such calculations were performed in the design of the GJTE diodes described herein. Calculations were required only to ensure that the carbon layer was thick enough (i.e., maximum thickness) to block all of the implanted ions. This flexibility is the result of the implant depth contour and the implant concentration gradient shown in FIG. 2.

Other methods for fabricating a GJTE were explored in addition to the carbon mask. Techniques for making a graded SiO$_2$ implant mask were developed first. In fact, using SiO$_2$ probably is preferred over carbon since processes for readily depositing SiO$_2$ films are already in widespread use in the semiconductor industry.

Figure 6:
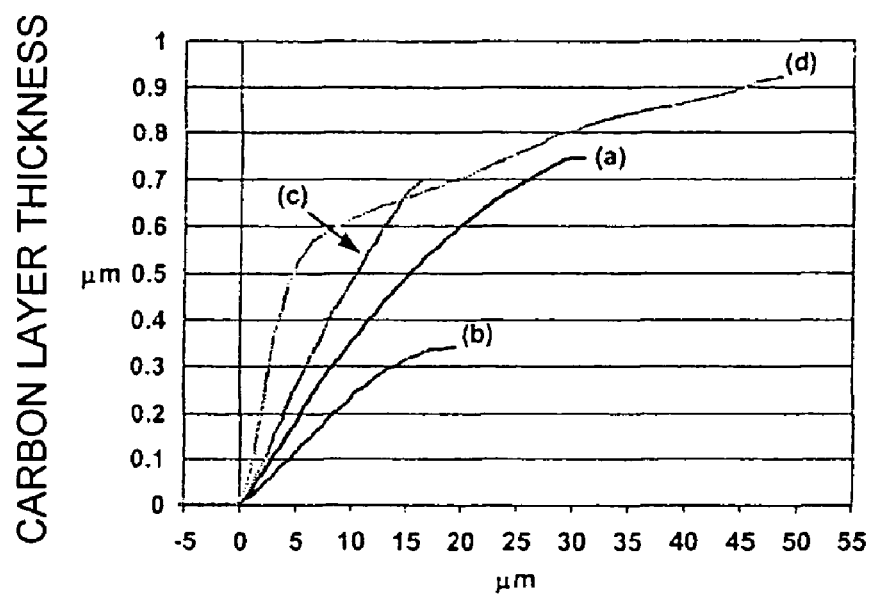
FIG. 6 illustrates thickness profiles for $SiO_2$ films etched with four different photoresist etch masks.

The basic approach for making an SiO$_2$ GJTE mask starts with deposition of a thick oxide layer that blocks the highest energy ions used during implantation. A graded photoresist layer is then deposited and used as a mask for etching the SiO$_2$. During reactive ion etching of the oxide film, the graded portion of the photoresist is gradually etched away. As more oxide surface is exposed to the ionized etching gas, the profile of the SiO$_2$ begins to resemble that of the photoresist. FIG. 6 shows the profiles of four different SiO$_2$ films etched with different photoresist masks. The sample represented by curve (a) was etched with an AZ5214 mask that was prepared using procedures that were described previously for the carbon film mask. However, the photoresist was spun on at 1000 rpm instead of 400 rpm, after which the sample was baked on a 114° C. hot plate for 2.5 min. The same exposure conditions were used, and the developed sample was baked in a 90° C. oven for 2 hours. At this point, the photoresist had a maximum thickness of around 3.5 µm. All four of the samples in FIG. 6 were exposed a short time prior to etching in an oxygen plasma in order to remove any residue left on the exposed SiO$_2$ after developing. Etching was carried out at 13.6 MHz in flowing NF$_3$ at approximately 65 mTorr. The RF power supply was set at 18 W, giving a power density of about 0.5 W/cm$^2$. The RF electrode was cooled with chilled water (~10° C.). These conditions produced an SiO$_2$ etch rate of about 70 nm/min, and a photoresist rate of around 250–260 nm/min. Other etch gas chemistries can be used to etch the SiO$_2$. Pure NF$_3$ was used here simply because it was available. Oxygen could be added to the etch gas to speed the photoresist etch rate steeper etch profiles. The profile can also be adjusted by changing the speed at which the photoresist is spun on. This is illustrated by curve (b) in FIG. 6. Sample (b) had an AZ5214 photoresist spun on at 4000 rpm and was exposed for 30 sec with the same mask/substrate spacing used to produce curve (a). The photoresist thickness for these conditions was around 1.6 µm.

Beveled implant masks were also produced without exposing the photoresist with the mask/substrate gap mentioned above. The nearly linear profile represented by curve (c) in FIG. 6 was obtained with a sample etched with a mask of Microposit STR®1045 photoresist. The STR 1045 photoresist is much thicker and softer than the AZ5214 photoresist. The photoresist was spun on at 4000 rpm for 30 sec and baked for 1.5 min at 100° C. The sample was exposed for 30 sec at 160 W with the mask in contact with the photoresist surface. A H$_2$O:351 (4:1) solution was used for developing. The sample was transferred to a 2" silicon wafer on a hot plate (~200° C.) and then baked for about 10 min. on the hot plate at 100° C. The post-develop bake caused the STR1045 photoresist to flow and thus create a beveled profile at the edges. The photoresist at this point was about 5.5 µm thick. Etching for sample (c) was conducted with the same parameters used for samples (a) and (b).

Figure 7:
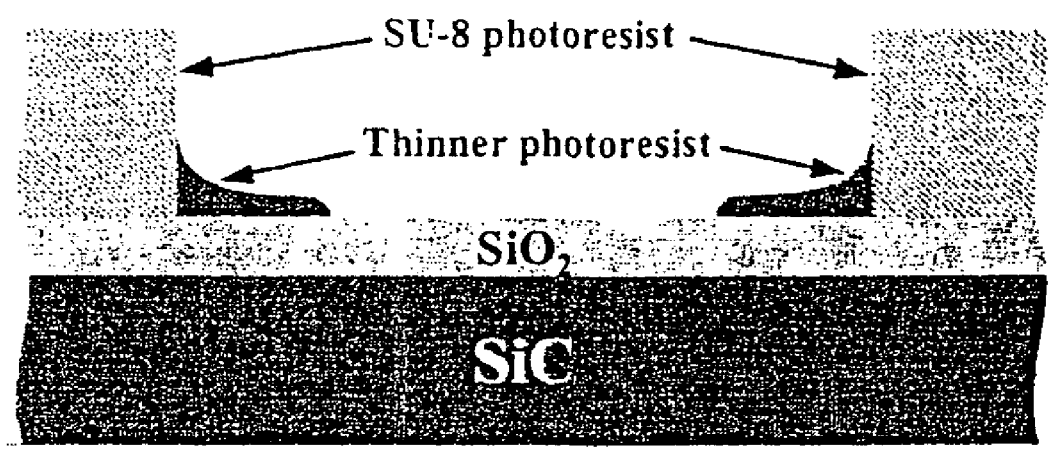
FIG. 7 illustrates a cross-section of a compound photoresist mask used for reactive ion etching of an $SiO_2$ implantation mask.

Another graded photoresist etch mask was developed by inverting a method developed previously for etching beveled SiC mesas. A thick (~7 µm) layer of Nano™ XP SU-8 25 negative photoresist was applied and patterned with 450 µm diameter holes. SU-8 is a thick negative photoresist that is very durable when cured. Subsequently, AZ5412 was spun on at 3000 rpm over the SU-8 and baked on a hot plate at 115° C. for 2 min. Smaller diameter holes were then opened inside the 450 µm openings in the SU-8. The exposure for this sample was conducted with the lithography mask in contact with the sample. After developing, this etch mask was used to create the SiO$_2$ profile represented by curve (d) in FIG. 6. Exposing with a gap between the lithography mask and the substrate, as was the case for curve (a) and curve (b), would have smoothed out the steep shoulder seen within the first 10 µm of the profile. Surface tension between the SU-8 and the thinner, positive photoresist causes the thinner photoresist to creep up the SU-8 wall, thus producing a graded profile as illustrated in FIG. 7. A slower spin speed for the AZ5214 or possibly using a thicker photoresist such as the STR1045 would have made this effect more pronounced. However, the profiles produced with this method were not as uniform as those produced with the other methods disclosed.

All of the techniques described herein can also be used to make a graded ion implantation mask from materials other than SiO$_2$. Polycrystalline silicon would likewise be a good material to use since procedures for depositing and reactive ion etching with this material are also well established.

The corresponding structures, materials, acts, and equivalents of any mean plus function elements in any claims are intended to include any structure, material or acts for performing the function in combination with the other claimed elements as specifically claimed.

While the invention has been particularly shown and described with reference to a preferred embodiment thereof, it will be understood by those skilled in the art that various other changes in form and detail may be made without departing from the spirit and scope of the invention.

What is claimed is:

1. A method of fabricating a graded junction termination extension for an electronic device using ion implantation in a silicon carbide substrate, comprising:

spinning a positive photoresist onto the silicon carbide substrate;

exposing the positive photoresist to ultraviolet light through a mask with a surface of the positive photoresist separated from the mask;

developing the photoresist/substrate in a solution wherein the photoresist dissolves at a rate proportional to the amount of light absorbed during the exposure to produce edges that are gradually sloped; and annealing the photoresist/substrate to convert the positive photoresist into a carbon film on the substrate.

2. The method of fabricating a graded junction termination extension of claim 1 wherein the mask is self-aligning.

3. The method of fabricating a graded junction termination extension of claim 1 wherein the mask is separated from the positive photoresist by at least one millimeter.

4. The method of fabricating a graded junction termination extension of claim 1 further comprising baking the photoresist/substrate after developing the photoresist/substrate in a solution.

5. The method of fabricating a graded junction termination extension of claim 1 wherein annealing comprises annealing the photoresist/substrate in argon.

6. The method of fabricating a graded junction termination extension of claim 1 wherein annealing comprises annealing the photoresist/substrate in argon at slightly above atmospheric pressure.

7. The method of fabricating a graded junction termination extension of claim 1 further comprising removing the carbon film using an oxygen plasma.

8. The method of fabricating a graded junction termination extension of claim 1 further comprising sputtering an additional mask layer to the annealed substrate to bring the low energy ions to the surface after annealing the photoresist/substrate.

9. The method of fabricating a graded junction termination extension of claim 8 wherein the additional mask layer is a molybdenum layer sputtered over a surface of the annealed substrate.

10. The method of fabricating a graded junction termination extension of claim 8 further comprising chemically etching away the additional mask layer before annealing the ion-implanted substrate.

11. The method of fabricating a graded junction termination extension of claim 1 further comprising implanting a plurality of ions into the annealed substrate with varying energies.

12. The method of fabricating a graded junction termination extension of claim 11 wherein the plurality of ions implanted into the substrate are aluminum ions.

13. The method of fabricating a graded junction termination extension of claim 11 further comprising annealing the substrate implanted with a plurality of ions to activate the ions.

14. A method of fabricating a graded junction termination extension for an electronic device using ion implantation in a semiconductor material substrate, comprising:

spinning a positive photoresist onto the semiconductor material substrate;

exposing the positive photoresist to ultraviolet light through a mask with a surface of the positive photoresist separated from the mask; developing the photoresist/substrate; and annealing the photoresist/substrate to convert the positive photoresist into a carbon film on the substrate.

15. The method of claim 14 wherein the mask is self-aligning.

16. The method of claim 14 wherein the positive photoresist dissolves at a rate proportional to the amount of light exposed during exposure to produce edges that are gradually sloped.

17. The method of claim 14 wherein the mask is separated from the positive photoresist by at least one millimeter.

18. The method of claim 14 wherein annealing comprises annealing the photoresist/substrate in a vacuum.

19. The method of claim 14 wherein annealing comprises annealing the photoresist/substrate in argon.

20. The method of claim 19 wherein the argon is slightly above atmospheric pressure.

21. A method of fabricating a graded junction termination extension for an electronic device using ion implantation in a substrate, comprising:

generating a gradient mask on the substrate;

sputtering an additional mask layer on the substrate to attract low energy ions;

implanting a plurality of ions into the substrate at varying energy levels; and activating the ions by annealing the implanted substrate.

22. The method of claim 21 wherein generating the gradient mask comprises exposing a positive photoresist to ultraviolet light through a self-aligned mask with the photoresist separated from the mask to defocus an edge of the ultraviolet light.

23. The method of claim 21 wherein generating the gradient mask comprises exposing a positive photoresist through a mask in contact with the photoresist surface to form a beveled mask.

24. The method of claim 21 wherein generating the gradient mask comprises placing a thick oxide layer of silicon dioxide to block high energy ions.

25. The method of claim 24 further comprising depositing a graded photoresist layer for etching the silicon dioxide.

26. The method of claim 25 wherein depositing the graded photoresist layer comprises exposing a positive photoresist to ultraviolet light through a self-aligned mask with the photoresist separated from the mask to defocus an edge of the ultraviolet light.

27. The method of claim 21 wherein generating the gradient mask comprises applying a negative photoresist with patterned holes and spinning a positive photoresist on top of the negative photoresist having smaller openings within the patterned holes, further wherein the negative photoresist is applied at a thickness greater than the thickness of the positive photoresist, and further wherein a surface tension causes the positive photoresist to move up the walls of the patterned holes.

28. The method of claim 21 wherein the additional mask layer is a molybdenum layer sputtered over a surface of the annealed substrate.

29. The method of claim 21 further comprising implanting a plurality of ions into the annealed substrate with varying energies using an accelerator.

30. The method of claim 29 wherein the plurality of ions implanted into the substrate are aluminum ions.

31. The method of claim 29 further comprising chemically etching away the additional mask layer before annealing the ion-implanted substrate.

32. The method of claim 29 further comprising annealing the substrate implanted with a plurality of ions to activate the ions.

* * * * *